United States Patent
Miyata

(10) Patent No.: US 8,431,998 B2
(45) Date of Patent: Apr. 30, 2013

(54) INSULATED GATE SEMICONDUCTOR DEVICE

(75) Inventor: Takuji Miyata, Ora-Gun (JP)

(73) Assignees: SANYO Semiconductor Co., Ltd., Ora-gun (JP); Semiconductor Components Industries, LLC, Phoenix, AZ (US)

( * ) Notice: Subject to any disclaimer, the term of this patent is extended or adjusted under 35 U.S.C. 154(b) by 181 days.

(21) Appl. No.: 12/692,777

(22) Filed: Jan. 25, 2010

(65) Prior Publication Data

US 2010/0187640 A1  Jul. 29, 2010

(30) Foreign Application Priority Data

Jan. 29, 2009  (JP) .................................. 2009-018517

(51) Int. Cl.
*H01L 23/62* (2006.01)

(52) U.S. Cl.
USPC ..... 257/355; 257/330; 257/341; 257/E27.016

(58) Field of Classification Search .................. 257/330, 257/341, E27.016, 355
See application file for complete search history.

(56) References Cited

U.S. PATENT DOCUMENTS

| 6,265,744 B1 * | 7/2001 | Okumura ....................... 257/330 |
| 6,638,850 B1 * | 10/2003 | Inagawa et al. ............... 438/621 |
| 2005/0082611 A1 * | 4/2005 | Peake et al. .................... 257/341 |
| 2008/0079078 A1 * | 4/2008 | Noguchi et al. ............... 257/355 |
| 2009/0261418 A1 * | 10/2009 | Yajima ........................... 257/356 |

FOREIGN PATENT DOCUMENTS

JP  2007-042817  2/2007

* cited by examiner

*Primary Examiner* — John C Ingham
(74) *Attorney, Agent, or Firm* — Morrison & Foerster LLP

(57) ABSTRACT

A two-layer electrode structure is provided. A protection diode is provided not to overlap a gate pad portion. Cells and a first one of source electrode layers can be provided below the gate pad portion, so that the differences in resistance among various points in the source electrode layers can be decreased. In addition, the protection diode is positioned adjacent to a device region and at an end portion, of a chip, outward of the device region in such a way as to be in the closest proximity to the gate pad portion. A larger device region with efficient transistor operation can thus be secured, and the resistance of the first source electrode layer below a wiring portion can be reduced.

7 Claims, 11 Drawing Sheets

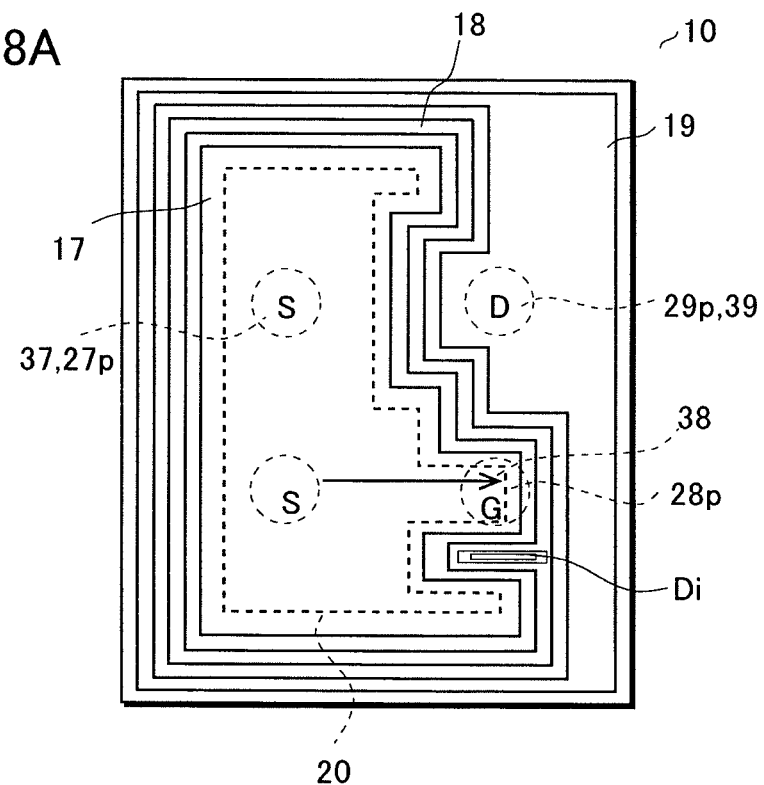
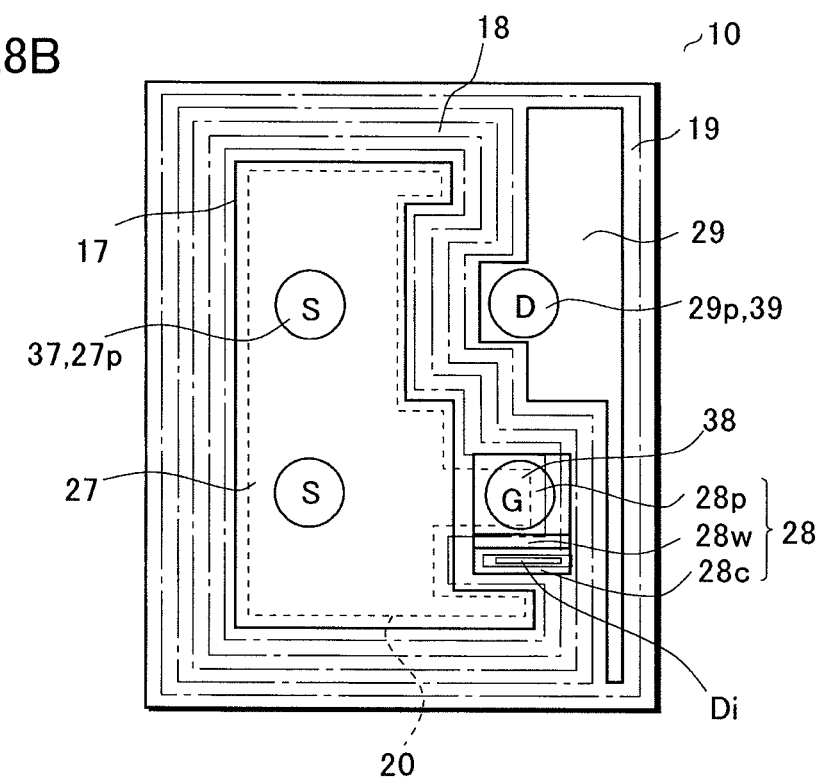

Prior Art

Prior Art

INSULATED GATE SEMICONDUCTOR DEVICE

This application claims priority from Japanese Patent Application Number JP 2009-18517 filed on Jan. 29, 2009, the content of which is incorporated herein by reference in its entirety.

BACKGROUND OF THE INVENTION

1. Field of the Invention

The present invention relates to an insulated gate semiconductor device, and particularly to an insulated gate semiconductor device capable of reducing a region where no transistor cells can be provided (hereinafter, a region where no transistor is (can be) formed) and thereby increasing an area of a diode region.

2. Description of the Related Art

In an insulated gate semiconductor device, a source electrode layer and a gate electrode layer are formed on a principal surface of a substrate. In addition, external connection means such as a bump electrode and a bonding wire is bonded to each of the source electrode layer and the gate electrode layer.

In addition, there has been known an insulated gate semiconductor device in which an electrode on a surface of a substrate has a two-layer structure so as to reduce resistance in an electrode portion.

A conventional insulated gate semiconductor device 200 that has the two-layer electrode structure will be described by referring to FIG. 10. The description that follows is based on an example of a MOSFET. FIG. 10 is a sectional view.

MOSFET transistor cells 225 (referred to as cells below) are formed in a device region 220.

Each of the cells 225 is formed in a p type channel layer 204 formed on a surface of an n– type epitaxial layer 202 which is formed on an n+ type silicon semiconductor substrate 201 and serves as a drain region of the cell 225. Trenches 208 are formed to penetrate the channel layer 204. A gate oxide film 211 is formed on an internal wall of each of the trenches 208. A gate electrode 213 is buried in each trench 208. Each of the gate electrodes 213 is connected to a first gate electrode layer 218 and further to a protection diode Di via a connection portion (not illustrated in FIG. 10) that is formed by patterning polysilicon.

Source regions 215 are diffusion regions each formed by implanting n+ type impurities in a portion, adjacent to the trench 208, in a surface of the channel layer 204. In addition, body regions 214, which are diffusion regions of p+ type impurities, are each provided in a portion, between two adjacent ones of the source regions 215, in a surface of the channel layer 204. Interlayer insulating films 216 are formed respectively on the gate electrodes 213. Contact holes are formed between the interlayer insulating films 216. A first source electrode layer 217 is in contact with the source regions 215 and the body regions 214 via the contact holes.

The first gate electrode layer 218 is provided over the protection diode Di, and is connected to a first end portion of the protection diode Di. The first end portion of the protection diode Di is thus connected to the gate electrodes 213. A second end portion of the protection diode Di is connected to the first source electrode layer 217.

The first source electrode layer 217 is formed to cover the entire area of the device region 220, and is connected to the source regions 215 and the body regions 214 of the cells 225. The first gate electrode layer 218 is formed above a portion of the substrate surface located outside the device region 220.

A second source electrode layer 227 and a second gate electrode layer 228 are formed to reduce the resistance in the electrode portions. A nitride film 221, for example, is formed to cover a part of the surface of the first source electrode layer 217. Then, the second source electrode layer 227 is formed to cover the first source electrode layer 217 and the nitride film 221. The second source electrode layer 227 thus formed is allowed to be in contact with the first source electrode layer 217. Meanwhile, another nitride film 221, for example, is formed to cover the first gate electrode layer 218. Then, the second gate electrode layer 228 is formed to cover the first gate electrode layer 218 and this nitride film 221. The second gate electrode layer 228 thus formed is allowed to be in contact with the first gate electrode layer 218.

A nitride film 223, which is to serve as the outermost surface of the chip, is formed on the second source electrode layer 227 and the second gate electrode layer 228. Opening portions are formed in the nitride film 223. A portion of the second gate electrode layer 228 is thus exposed outside through the opening, and the exposed portion serves as a region where external connection means is bonded (hereafter, the portion will be referred to as a "gate pad portion 228p"). Likewise, a portion of the second source electrode layer 227 is thus exposed outside through the opening, and the exposed portion serves as a region where external connection means is bonded (hereafter, the portion will be referred to as a "source pad portion 227p"). The nitride films 221 are formed below the gate pad portion 228p and the source pad portion 227p, and function to soften the impact caused by wire bonding (this technology is described for instance in Japanese Patent Application Publication No. 2007-42817).

FIGS. 11A and 11B are plan views illustrating an example of conventional semiconductor chips (denoted by 210 in FIG. 11A). Note that the semiconductor chip shown in this example uses bump electrodes as external connection means and is thus mounted on a packaging substrate by the flip-chip technique. In addition, in the semiconductor chip shown in this example, two MOSFET-device regions are integrated in a single substrate (chip) while the two MOSFETs share a single common drain region (hereafter, a semiconductor chip of this type will be referred to as a "common-drain MOSFET"). Note that if those constituent elements shown in FIGS. 11A and 11B are the same ones that are shown in FIG. 10, the reference numerals used in FIG. 10 are also used to denote the constituent elements in FIGS. 11A and 11B.

The common-drain MOSFET 210 includes two gate pad portions 228p, 228p' and two source pad portions 227p, 227p on a principal surface of the substrate (chip). Gate bump electrodes 238, 238' and source bump electrodes 237, 237' are formed as the external connection means respectively for the pad portions 228p, 228p', 227p, and 227p'. A current flows from the source bump electrode 237 through the common drain region to the source bump electrode 237'.

A protection diode Di smaller than the gate pad portion 228p is formed below the gate pad portion 228p to overlap the gate pad portion 228p. A first end portion of the protection diode Di is connected to the first gate electrode layer 218, while a second end portion of the protection diode is connected to the first source electrode layer 217 (see FIG. 10). The first gate electrode layer 218 extends to form a gate extraction electrode 218w formed in the peripheral portion of the substrate, and is thus connected further to the gate electrode (not illustrated).

As FIGS. 11 to 12B show, the first gate electrode layer 218 is formed below the gate pad portion 228p to overlap and contact the gate pad portion 228p. Below the first gate electrode layer 218, the protection diode Di is provided between the gate and the source. The gate pad portion 228p, the first gate electrode layer 218, and the protection diode Di overlap one another. The protection diode Di is formed to have a smaller area than the area covered by the gate pad portion 228p (see FIGS. 11A and 11B).

The protection diode Di is formed on an insulating layer formed on the substrate surface. The protection diode Di is formed by patterning polysilicon into a desired shape. Accordingly, for reasons associated with the structure or with the manufacturing processes of the protection diode Di, neither the first source electrode layer 217 nor the transistor cells covered by and connected to the first source electrode layer 217 can be provided below the protection diode Di. Consequently, cells are provided in the device region 220 indicated by the dashed lines in FIG. 11.

In addition, the gate pad portion 228p and the protection diode Di overlap each other, and are located at the inner side of the device region 220 than the outermost cells of the device region 220. Accordingly, for connecting the gate extraction electrode 218w, which is the first layer located in the peripheral portion of the chip, to the gate pad portion 228p, a wiring portion 228w has to be formed as the first layer. In addition, a wiring portion of the polysilicon layer which overlaps the wiring portion 228w and which is connected to the protection diode Di is also provided below the wiring portion 228w. Accordingly, neither the first source electrode layer 217 nor the cells can be provided below the wiring portion 228w.

The gate pad portion 228p occupies at least an area having a side (diameter) of several tens of micrometers approximately if such means as bonding wires are employed as external connection means. If bump electrodes are employed instead of the bonding wires, the gate pad portion 228p sometimes occupies an area having a side (diameter) of 300 µm or even larger.

The area that the protection diode Di occupies is determined depending upon the breakdown voltage. A sufficiently high breakdown voltage is often obtainable even if the area of the protection diode Di is smaller than the area of the gate pad portion 228p. FIG. 11B illustrates the protection diode Di so that the area of the protection diode Di is approximately equal to the area of the gate pad portion 228p and to the area of the first gate electrode layer 218. In practice, however, the polysilicon layer is formed to have an area approximately equal to the area of the gate pad portion 228p and to the area of the first gate electrode layer 218, while the protection diode Di is formed in the polysilicon layer to have an area smaller than the area of the gate pad portion 228p and to the area of the first gate electrode layer 218.

In conventional cases, however, the protection diode Di is formed below the gate pad portion 228p so that the protection diode Di and the gate pad portion 228p overlap each other. Accordingly, the semiconductor device has a structure that does not allow transistor cells to be provided below the gate pad portion 228p. Consequently, a larger area has to be left as the region where no transistor is (can be) formed that does not substantially function as the device region. Such a structure restricts improvement in the characteristics of the semiconductor device.

Suppose a case where the protection diode Di may have a smaller area that depends on the required breakdown voltage and the protection diode Di is formed to have a smaller area than the area of the gate pad portion 228p. Even in this case, no transistor cells can be provided below the gate pad portion 228p.

In a conventional structure, no cells are provided below the gate pad portion 228p, but are provided in the area surrounding the gate pad portion 228p. A semiconductor device having the conventional structure has another problem of the difficulty in accomplishing uniform operations of the cells. Specifically, the first source electrode layer 217 and the second source electrode layer 227 (since the two source electrode layers 217 and 227 have the same patterns, the two source layers 217 and 227 will be referred to, by use of a generic term, as the "source electrode layers") are patterned in areas not including the region where the gate pad portion 228p is to be provided. Accordingly, in a region far from the source pad portion 227p, the current flowing in each of the source electrode layers in a horizontal direction with the surface of the substrate flows around the gate pad portion 228p. A problem thus caused is an increase in the resistance within each of the source electrode layers.

The problem occurs not only in the case of semiconductor chips having a flip-chip mounting structure but also in the case of semiconductor chips whose external connection means are provided by wire bonding or metal plates.

FIGS. 11A and 11B are provided to illustrate the case of a common-drain MOSFET. A similar problem occurs in the case of MOSFETs of up-drain structure with the drain electrode extracted out to the same principal surface that the source electrode layer and the gate electrode layer are formed on. In addition, a similar problem occurs also in the case of ordinary MOSFETs with the drain electrode formed on the back-side surface.

Now, the problem will be described in further detail below. The positions of the pad portions within a semiconductor chip are preferably determined according to the characteristics of the semiconductor chip as appropriate. Such positioning, however, is sometimes impossible due to the constraints imposed by the pattern. For example, in the case where bump electrodes 237, 237', 238, and 238' are formed, the positions of the bump electrodes 237, 237', 238, and 238' are constrained by the pattern formed on the packaging substrate. The positions of the pad portions are determined, for example, according to the user's requirements. Specifically, a larger-sized chip tends to have the bump electrodes positioned closer to the center of the chip rather than in the peripheral portions. For this reason, the source pad portion 227p and the gate pad portion 228p are formed at inner-side positions than the cells located at the outermost positions of the device region 220.

Incidentally, a current pass is formed in the case shown in FIGS. 11A and 11B from the source bump electrode 237 serving as the input terminal to the source bump electrode 237' serving as the output terminal through the substrate (a shared drain region).

In terms of the pass of the current flow through the source electrode layer of each MOSFET, the current flows from the source pad portion 227p (likewise in the case of the source pad portion 227p') to end portions of the source electrode layer. Now suppose a case where the gate pad portion 228p is positioned at the inner side than the cells positioned at the outermost positions of the device region 220. In this case, the current flowing through the cells located in the portions surrounding the gate pad portion 228p, in particular, through the cells positioned between the gate pad portion 228p and the end portions of the chip (i.e., positioned in the area indicated by the alternate long and short dash line in FIG. 11A), flows from the source bump electrode 237 going all the way around the gate pad portion 228p. Accordingly, the current flowing through these cells has to pass through a longer pass in the source electrode layer than in the case of the current flowing through the cells positioned near the source pad portion 227p. The resistance in the case of the longer pass is higher than in the case of the shorter pass.

Accordingly, the device region 220 includes both a region where the current pass for the cells is shorter and has lower resistance (i.e., a region in the vicinity of each of the source bump electrodes 237, 237') and a region where the current pass for the cells is longer and has higher resistance (a region r1 indicated by the alternate long and short dash line in FIG. 11A. The cells of lower resistance perform well, but the cells of higher resistance perform unsatisfactorily. If the gap in the performance of these two groups of cells becomes wider, it is difficult for the cells within the device region to accomplish uniform operation. This causes a problem of deterioration of the switching characteristics.

FIG. 11A shows regions r2 each of which is located in an area between the gate pad portion 228p and an end portion of the device region 220. Each of the region r2 has an area of a smaller width available for the source electrode layer to be placed in the region r2. The cells that the current can reach after passing through the regions r2 have larger resistance, resulting in a problem of difficulty in the uniform operation.

The problem occurs not only in the common-drain MOSFETs but also in the MOSFETs of up-drain structure and of ordinary MOSFETs with the drain electrode foamed on the back-side surface. A similar problem occurs in any MOSFET in which the gate pad portion is formed at the inner side than the outermost transistor cells in the device region and the transistor cells are arranged so that the current flowing through the source electrode layer goes all the way around the gate pad portion.

SUMMARY OF THE INVENTION

The invention provides an insulated gate semiconductor device that includes a semiconductor substrate, a device region which is a region of the semiconductor substrate in which a plurality of cells of insulated gate transistors are formed, and a first top terminal electrode layer disposed on the semiconductor substrate so as to cover a first portion of the device region. The first top terminal electrode layer is electrically connected to the device region but is not in direct physical contact with the first portion, and the first portion has the cells therein. The device also includes a second top terminal electrode layer disposed on the semiconductor substrate so as to cover a second portion of the device region. The second top terminal electrode layer is electrically connected to the device region but is not in direct physical contact with the second portion. The second portion has the cells therein. The second top terminal layer includes a pad portion to which an electrical connection is made to receive a control signal for the transistors in the device region. The device further includes a protection diode formed in the semiconductor substrate so as to be outside the device region but adjacent the device region. In plan view of the semiconductor substrate, the pad portion and the protection diode are adjacent to each other but do not overlap.

BRIEF DESCRIPTION OF THE DRAWINGS

FIGS. 8A and 8B are plan views describing an insulated gate semiconductor device according to a third embodiment of the invention.

DESCRIPTION OF THE INVENTIONS

Some embodiments of the invention will be described by referring to FIGS. 1A to 9. The detailed description that follows is based on an example where metal oxide semiconductor field effect transistor (MOSFET) transistor cells are arranged in the device region.

A first embodiment of the invention is a case where a common-drain MOSFET 100 including two MOSFETs 10, 10' sharing a common drain region are integrated on a single substrate (chip). In the common-drain MOSFET 100, for example, a source electrode of the MOSFET 10 is connected to an input terminal, while a source electrode of the MOSFET 10' is connected to an output terminal.

Figure 1A:
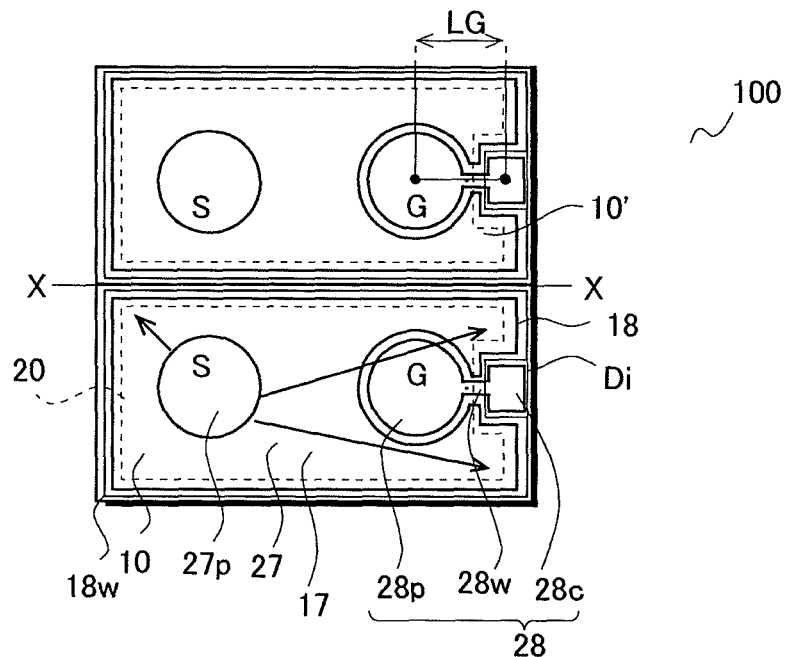
FIGS. 1A and 1B are plan views describing an insulated gate semiconductor device according to a first embodiment of the invention.
Figure 1B:
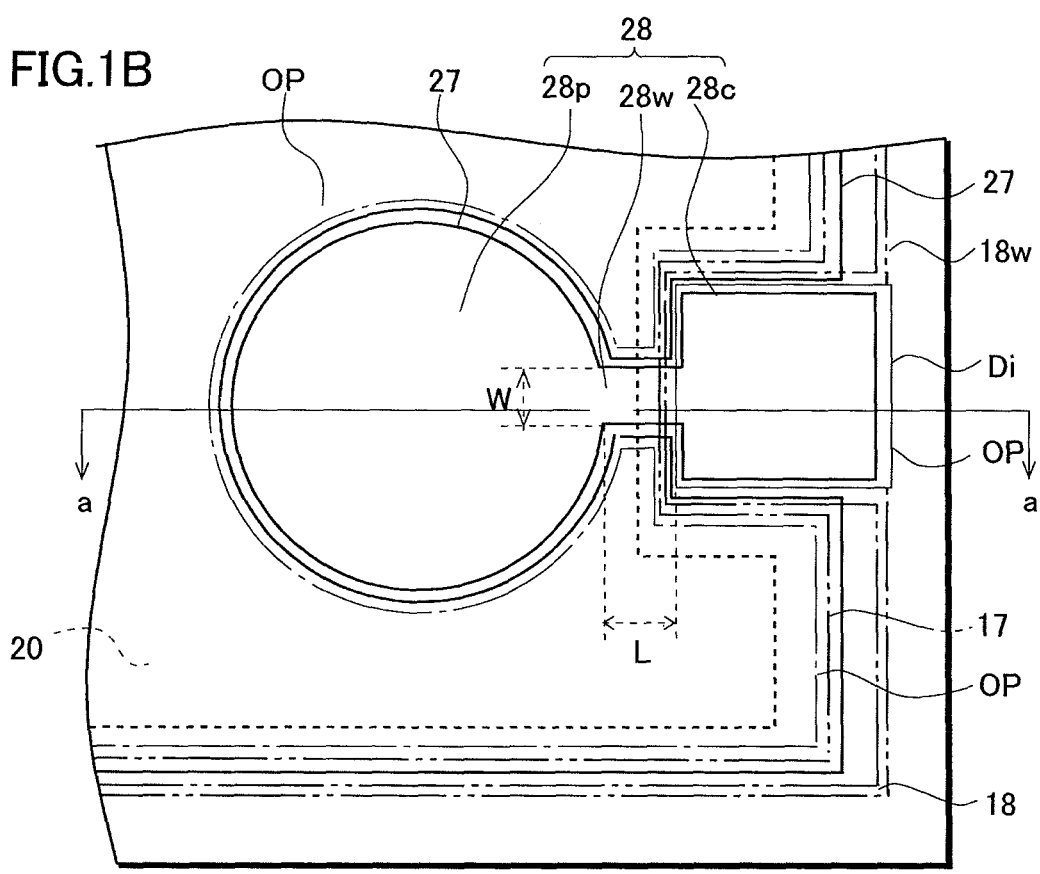
Figure 2A:
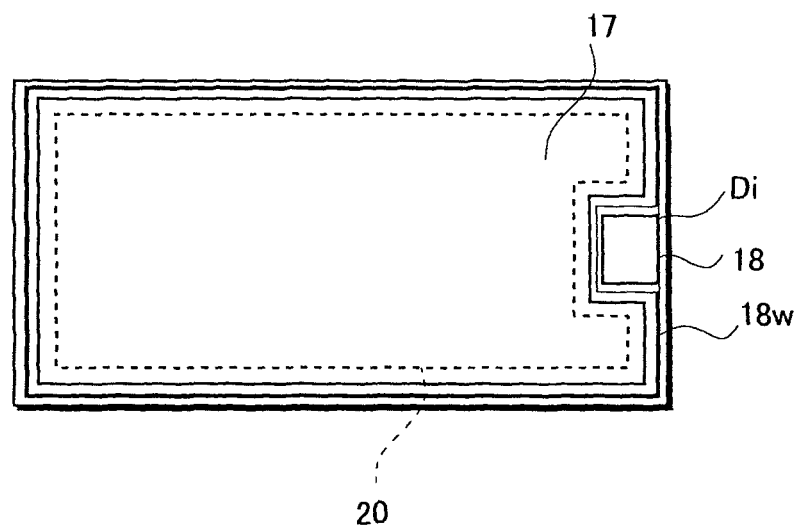
FIGS. 2A and 2B are plan views describing the insulated gate semiconductor device according to the first embodiment of the invention.
Figure 2B:
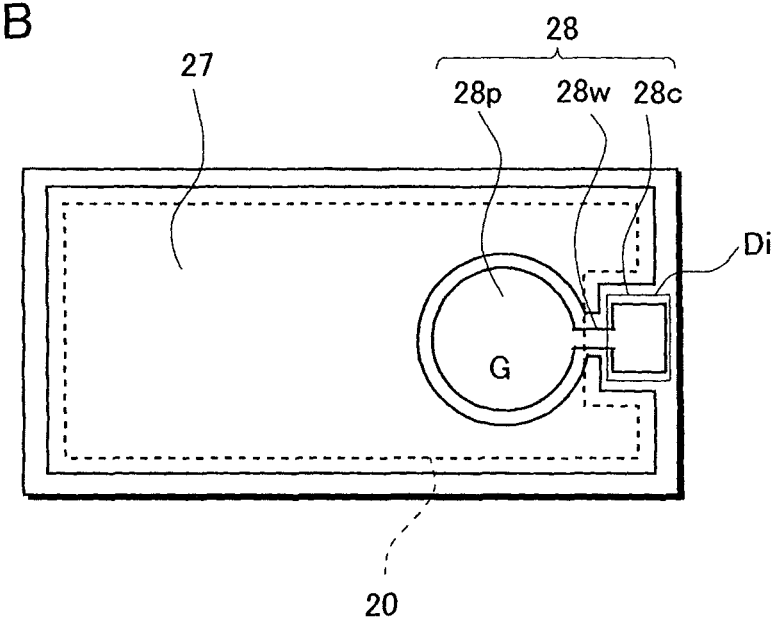
Figure 3:
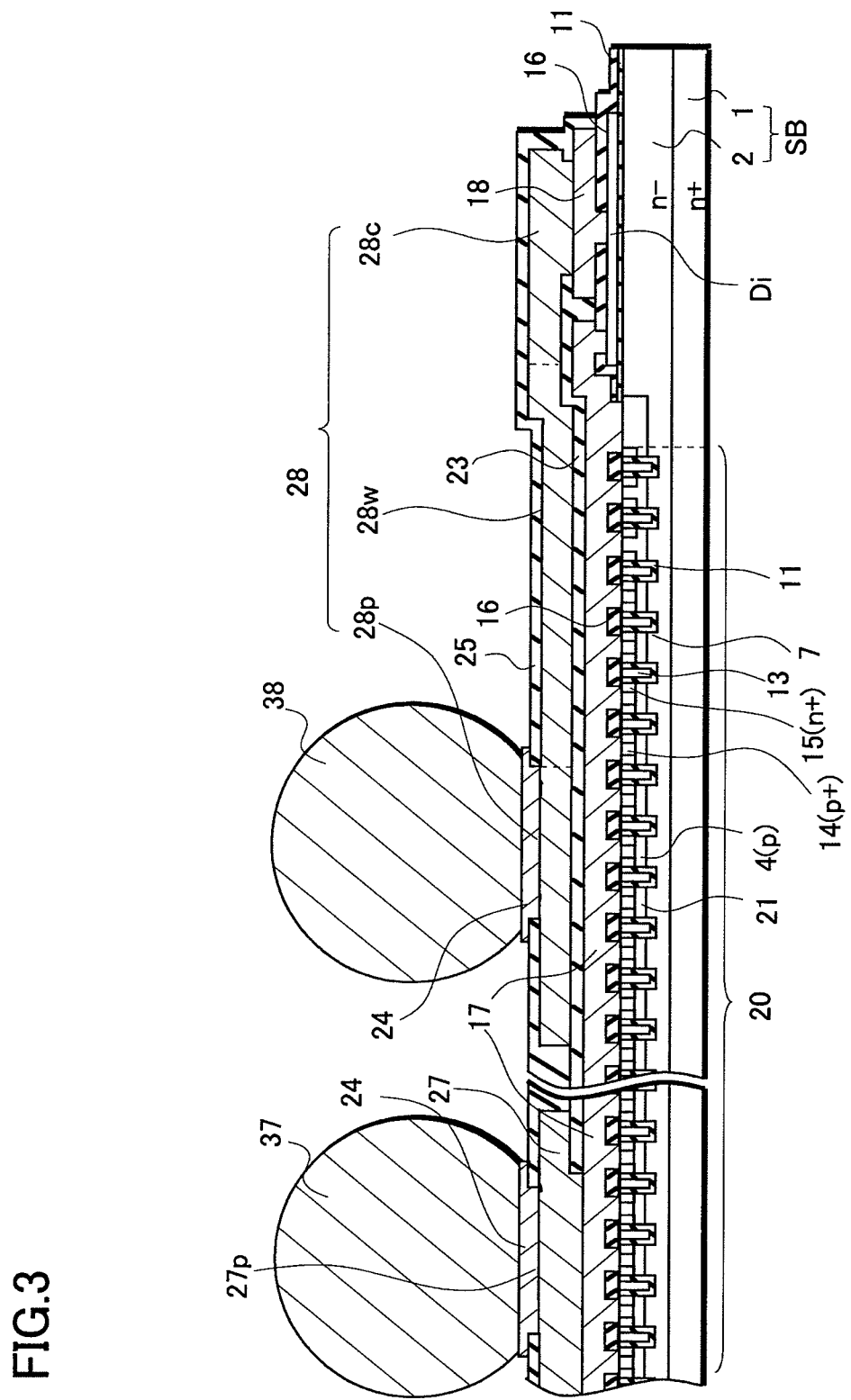
FIG. 3 is a sectional view describing the insulated gate semiconductor device according to the first embodiment of the invention.

FIGS. 1A and 1B are plan views each illustrating the common-drain MOSFET 100. FIG. 1A is a plan view illustrating the entire chip. FIG. 1B is an enlarged view illustrating a gate pad portion and the vicinity thereof. FIGS. 2A and 2B are plan views illustrating the electrode layers respectively in the entire MOSFET. FIG. 2A is a plan view illustrating the first layer. FIG. 2B is a plan view illustrating the second layer. FIG. 3 is a sectional view taken along the line a-a of FIG. 1B.

Each of the MOSFETs 10, 10' has a structure of the first embodiment. The MOSFETs 10, 10' are arranged side by side with each other to be symmetrical with respect to the center line X-X of a substrate (chip) SB. The MOSFETs 10, 10' have identical configurations. Accordingly, the description that follows is given by taking the MOSFET 10 as an example.

The MOSFET 10 includes a semiconductor substrate of a first general conductivity-type, a semiconductor layer of the first general conductivity-type, a device region, a first terminal electrode layer, and a second terminal electrode layer.

It is noted that conductivity types such as n+, n and n− belong in a general conductivity type, and conductivity types such as p+, p and p− belong in the other general conductivity type.

Now, the following description will be given by referring to FIGS. 1A to 2B. A device region 20 (indicated by the dashed lines) is formed on the surface of the substrate. Multiple MOSFET cells are arranged in the device region 20. A first terminal electrode layer 17 (indicated by double-dot chain lines in FIG. 1B; also illustrated in FIG. 2A) is formed to cover the entire area of the device region 20. The first terminal electrode layer 17 is connected to a first terminal electrode, and is the first layer of the kind. The first terminal electrode refers to an electrode connected to a first terminal (e.g., a source terminal) of each transistor. So, the above-mentioned first terminal electrode layer 17 that is the first layer of the kind is a first source electrode layer 17. A protection diode Di is provided in an end portion of the substrate surface. The protection diode Di to protect the gate insulating film of the MOSFET is formed between the gate and the source.

The providing of the protection diode Di in an end portion of the substrate surface has the following meaning. The protection diode Di is provided outside the device region 20 but is provided to be in closest proximity to the device region 20. At the same time, the protection diode Di is provided in a region so that no cells are provided between at least one side of the protection diode Di and a side of the chip (semiconductor substrate) located in closest proximity to the above-mentioned side of the protection diode Di.

In the example shown in FIGS. 1A to 2B, the protection diode Di is provided outside the device region 20 and near the center of a shorter side of the MOSFET 10 (chip) so that one side of a polysilicon layer that forms the outer ends of the protection diode Di can extend along the shorter side.

The protection diode Di is a bi-directional diode with plural pn junctions formed by alternately arranging ring-shaped n type semiconductor regions and p type semiconductor regions in a concentric ring shape in, for example, a polysilicon layer having a rectangular or an octagonal shape.

A second terminal electrode layer 18 is the first layer of the kind (indicated by double-dot chain lines in FIG. 1B; also illustrated in FIG. 2A) is formed over the protection diode Di. The second terminal electrode refers to an electrode connected to the control terminal (gate terminal) of each transistor. The second terminal electrode layer 18 is the first layer of the kind. So, the above-mentioned second terminal electrode layer 18 that is the first one of the kind is a first gate electrode layer 18.

An insulating film (e.g., a nitride film or an oxide film) having an opening portion OP is formed on the first source electrode layer 17 and first gate electrode layer 18. Another first terminal electrode layer 27, that is, the second layer of the kind (second source electrode layer 27), and another second terminal electrode layer 28, that is, the second layer of the kind (second gate electrode layer 28) are formed on the insulating film (see FIGS. 1B and 2B).

The second source electrode layer 27 includes a pad portion (source pad portion 27p), where external connection means is bonded. The source pad portion 27p is, for example, a portion of the second source electrode layer 27 exposed through an opening portion formed in an insulating film (not illustrated) which is formed to cover the second source electrode layer 27 and which is to be the outermost surface of the chip. The insulating film is, for example, a nitride film, an oxide film, or a polyimide film. The following description is based on an example of the insulating film made of a nitride film. A bump electrode (source bump electrode), for example, is bonded to the source pad portion 27p. The source bump electrode is connected, for example, to the input terminal, and thus serves as external connection means.

The second gate electrode layer 28 includes a pad portion (gate pad portion 28p), where external connection means is bonded. The second gate electrode layer 28 also includes a wiring portion 28w and a contact portion 28c (see FIGS. 1A, 1B and 2B). The gate pad portion 28p is a portion of the second gate electrode layer 28 exposed through an opening portion formed in the nitride film (not illustrated) which is formed to cover the second gate electrode layer 28 and which is to be the outermost surface of the chip. A bump electrode (gate bump electrode; not illustrate), for example, is bonded to the gate pad portion 28p. The gate bump electrode is connected to the control terminal, and thus serves as external connection means.

The contact portion 28c is formed, for example, in such a pattern as to overlap the protection diode Di. The contact portion 28c is connected to the first gate electrode layer 18 located below the contact portion 28c through an opening portion OP.

The wiring portion 28w extends on the first gate electrode layer 18, and connects the gate pad portion 28p to the contact portion 28c.

In this first embodiment, the protection diode Di is provided in an end portion of the chip, and the gate pad portion 28p and the protection diode Di do not overlap each other but are provided in the closest proximity to each other. To put it differently, the protection diode Di is positioned so that the distance LG between the protection diode Di and the gate pad portion 28p can be as short as possible.

If the gate pad portion 28p is formed into a circular shape as shown in FIG. 1A and the protection diode Di is also formed into a circular shape, the distance LG between the protection diode Di to the gate pad portion 28p is defined as the distance from the center of the circular-shaped gate pad portion 28p to the center of the circular-shaped protection diode Di. When the gate pad portion 28p and the protection diode Di are positioned in the closest proximity to each other, that is, when the gate pad portion 28p and the protection diode Di are provided to make the distance LG between the gate pad portion 28p and the protection diode Di as short as possible, the gate pad portion 28p and the contact portion 28c, which is connected to the protection diode Di through the first gate electrode layer 18, can be positioned in the closest proximity to each other. In addition, the wiring portion 28w can be formed in such a pattern that the gate pad portion 28p and the contact portion 28c (i.e., the protection diode Di) are connected with the shortest distance therebetween. Accordingly, the resistance for the current flowing through the source electrode layers can be prevented from increasing.

A gate extraction electrode 18w is provided in the vicinities of the perimeter of the substrate (chip). The gate extraction electrode 18w is connected to the gate electrodes in the device region 20 through a polysilicon layer (not illustrated) provided under the gate extraction electrode 18w so that the polysilicon layer and the gate extraction electrode 18w overlap each other. The gate extraction electrode 18w is also connected to the first gate electrode layer 18. In addition, the gate extraction electrode 18w is connected to the gate pad portion 28p through the contact portion 28c and the wiring portion 28w.

The following description is given by referring to FIG. 3. The semiconductor substrate SB is formed by laminating an n+ type silicon semiconductor substrate 1 and an n− type semiconductor layer (e.g., n− type epitaxial layer) 2 in this order. The semiconductor substrate SB thus formed serves as the drain region. A channel layer 4, which is a p type impurity region, is formed on the surface of the n− type semiconductor layer 2. Trenches 7 are formed to penetrate the channel layer 4 and thus to reach the n− type semiconductor layer 2. The trenches 7 are generally patterned into a lattice shape or a stripe shape in a planar pattern of a principal surface.

An insulating film (e.g. a gate oxide film) 11 is formed on the internal walls of each of the trenches 7. The thickness of the gate oxide film 11 is determined in accordance with the driving voltage of the MOSFET, and is approximately several hundreds of angstroms. In addition, a gate electrode 13 is formed in each of the trenches 7 by filling a conductive material into the trench 7. An example of the conductive material is polysilicon. For example, n type impurities are introduced in the polysilicon to make the resistance of the polysilicon low.

Source regions 15 are n+ type impurity regions formed by implanting n type impurities into the surfaces of the portions of the channel layer 4 that are adjacent to the trenches 7. Body regions 14 are formed in the surfaces of the channel layer 4 each of which is located between every two adjacent source regions 15. The body regions 14 are regions in which p+ type impurities are diffused. The body regions 14 stabilize the electric potential of the substrate SB. Accordingly, a single cell 21 of MOS transistor is formed as each of the portions located between every two adjacent trenches 7. A group of multiple cells 21 form a MOSFET device region 20.

For the sake of convenience in description, the device region 20 of this first embodiment is defined as a region where channels are formed along the gate electrode 13 and where the cells 21 functioning as transistors are arranged. To put it differently, the device region 20 of this first embodiment extends outwards to the region where the source region 15 of the outermost cell 21 is positioned.

A non-illustrated annular that is a high-concentration n type impurity region is formed as the perimeter of the substrate SB. In addition, a non-illustrated guard-ring that is a high-concentration p type impurity region is formed on the end portions of the channel layer 4.

In addition, since the semiconductor device shown in FIG. 1A is the common-drain MOSFET 100, the substrate SB serves as the drain region. Accordingly, no electrode layer (drain electrode) is formed on the back-side surface of the substrate SB. In the case of an ordinary, vertical-type MOSFET (i.e., a MOSFET with the current pass formed in the thickness direction of the substrate SB), a drain electrode (not illustrated) is formed on the back-side surface of the substrate SB.

Interlayer insulating films 16 are formed respectively on the gate electrode 13. The first source electrode layer 17 is formed on the substrate SB, covers the entire area of the device region 20 and is in contact with the source regions 15 and the body regions 14 which are exposed between every two adjacent interlayer insulating films 16.

A first insulating film 23 (e.g., a nitride film, or an oxide film) is formed on the first source electrode layer 17. The second source electrode layer 27 is formed on the first insulating film 23. An opening portion is formed in the first insulating film 23 to expose a portion of the first source electrode layer 17, and the second source electrode layer 27 is in contact with the exposed portion of the first source electrode layer 17. The second source electrode layer 27 is thus connected to the source regions 15 of the device region 20.

The insulating film 11 is formed on the surface of a portion of the substrate SB located outside the device region 20. The protection diode Di is formed on the insulating film 11. The protection diode Di is formed, for example, by patterning polysilicon and alternately arranging p type impurity regions and n type impurity regions in a concentric ring shape. The protection diode Di is connected between the source and the gate of the MOSFET 10.

The first gate electrode layer 18 is formed above a portion of the substrate SB located outside the device region 20 to overlap the protection diode Di, and is connected to the gate extraction electrode 18w formed in an end portion of the substrate SB (see FIG. 1). The gate extraction electrode 18w and the first gate electrode layer 18 are layers of, for example, the same metal, and are patterned to form the same continuous layer.

The gate extraction electrode 18w is formed to overlap a polysilicon layer (not illustrated) formed by extracting the gate electrodes 13 out to the surface of the substrate SB (i.e., out to the areas surrounding the substrate SB). The gate extraction electrode 18w is in contact with the polysilicon layer, and thus is connected to the gate electrodes 13.

The first insulating film 23 is formed on the first gate electrode layer 18, and the second gate electrode layer 28 is formed on the first insulating film 23. An opening portion is formed in the first insulating film 23, and a portion of the first gate electrode layer 18 is exposed through the opening portion. The second gate electrode layer 28 is in contact with the exposed portion of the first gate electrode layer 18. The second gate electrode layer 28 is connected to the gate electrodes 13 of the device region 20 through the first gate electrode layer 18 and the gate extraction electrode 18w. In addition, the second gate electrode layer 28 is connected to a first end portion of the protection diode Di through the first gate electrode layer 18. A second end portion of the protection diode Di is connected to the first source electrode layer 17.

The second source electrode layer 27 covers a portion of the device region 20 whereas the second gate electrode layer 28 covers the rest of the device region 20, that is, the portion that is not covered by the second source electrode layer 27. Accordingly, a portion of the first source electrode layer 17 is located below the second gate electrode layer 28.

A second insulating film 25 (e.g., a nitride film and solder resist formed on the nitride film) that is to be the outermost surface of the chip is formed on the second source electrode layer 27 and the second gate electrode layer 28. An opening portion is formed in a desired area of the second insulating film 25 to expose a portion of the second gate electrode layer 28. The exposed portion of the second gate electrode layer 28 is used as the bonding area (gate pad portion 28p) for external connection means such as a bump electrode (gate bump electrode 38). Note that the second insulating film 25 is sometimes omitted from the configuration, but even in such a case, the bonding area for the external connection means is used as the gate pad portion 28p.

An under bump metal (UBM) 24 is formed on the gate pad portion 28p. The UBM 24 is a metal layer formed by forming layers of metals by, for example, nonelectrolytic plating. For example, a layer of nickel (Ni; of a 2-μm thickness, for example), a layer of gold (Au; of a 500-Å thickness) are formed in this order on the gate pad portion 28p. Then, using the UBM 24 as a base electrode, the gate bump electrode 38 is formed by, for example, the screen printing method. The diameter of the gate bump electrode 38 is, for example, 300 μm, approximately.

An opening portion is formed in a desired area of the second insulating film 25 to expose a portion of the second source electrode layer 27. The exposed portion of the second source electrode layer 27 is used as the bonding area (hereafter, referred to as a source pad portion 27p) for external connection means such as a bump electrode (source bump electrode 37). An under bump metal (UBM) 24 is formed on the source pad portion 27p. The source bump electrode 37 is formed on the UBM 24.

Now, more detailed description is given concerning the second gate electrode layer 28. The second gate electrode layer 28 includes the gate pad portion 28p, the wiring portion 28w, and the contact portion 28c. In the second gate electrode layer 28, a portion that overlaps completely the protection diode Di (specifically, the outermost n type semiconductor region or the outermost p type semiconductor region of the protection diode Di) is referred to as the contact portion 28c.

The contact portion 28c extends to reach an area located above the first gate electrode layer 18. At least a portion of the contact portion 28c overlaps the first gate electrode layer 18 and the protection diode Di. The wiring portion 28w connects the gate pad portion 28p to the contact portion 28c. Accordingly, the gate pad portion 28p is connected to the gate extraction electrode 18w through the wiring portion 28w, the contact portion 28c, and the first gate electrode layer 18.

The second gate electrode layer 28 occupies an area larger than the area of the first gate electrode layer 18 (see FIG. 1B). A portion of the device region 20 is located below the gate pad portion 28p. Specifically, no part of the gate pad portion 28p overlaps the protection diode Di, and plural ones of the cells 21 are located right below the gate pad portion 28p.

As has been described thus far, the gate electrode layer of this first embodiment has a two-layer structure including: the first gate electrode layer 18, which overlaps the protection diode Di and is connected to the protection diode Di; and the second gate electrode layer 28 including the gate pad portion 28p that does not overlap the protection diode Di. This two-layer structure allows a portion of the device region 20 (i.e., some of the cells 21) to be located right below the gate pad portion 28p where the gate bump electrode 38 is bonded.

What can thus be accomplished is a significant reduction, from the conventional case, in the area of the region where no transistor is (can be) formed. Consequently, the device region 20 becomes larger, and the larger area occupied by the device region 20 reduces the on-resistance from the conventional case of a chip of the same size. In addition, if the device region 20 of the semiconductor chip of this first embodiment has an area equal to the corresponding area in the conventional case, the semiconductor chip of this first embodiment has a smaller area of the region where no transistor is (can be) formed right below the gate pat portion 28p than in the conventional case. Accordingly, reduction in size of the semiconductor chip can be achieved.

Figure 11A:
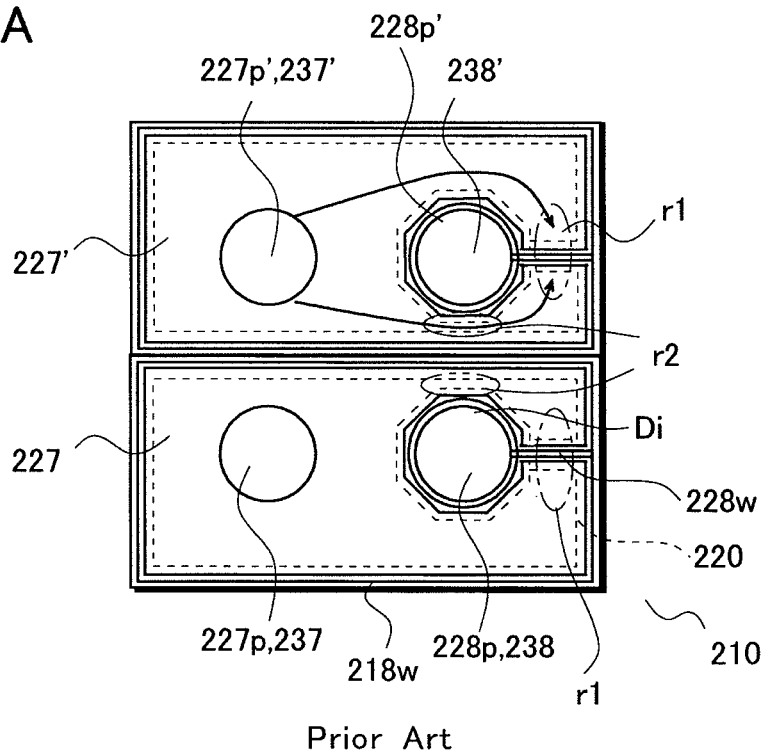
FIGS. 11A and 11B are plan views describing the conventional insulated gate semiconductor device.
Figure 11B:
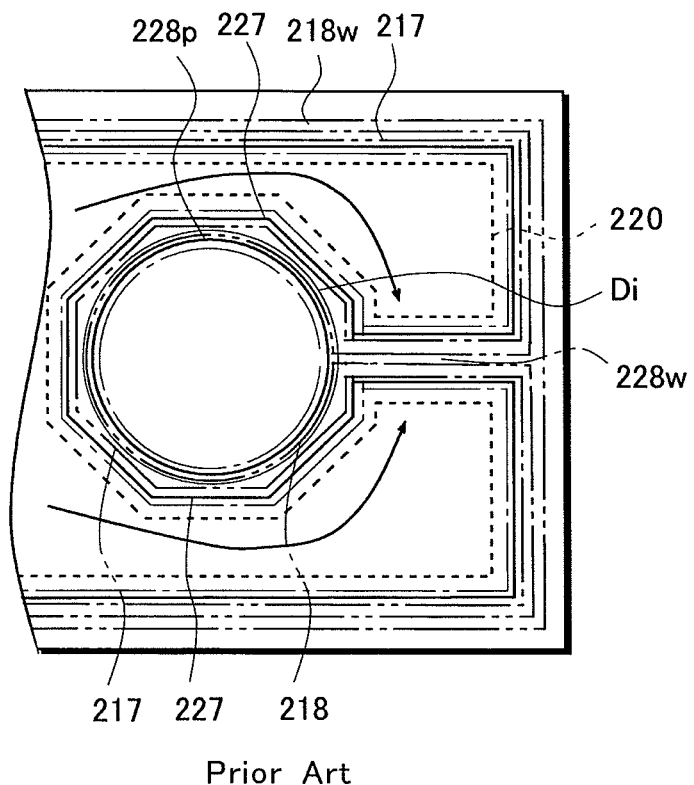

In addition, the two-layer structure can reduce the detouring of the current pass. Specifically, according to the conventional structure, the first source electrode layer 217 and the second source electrode layer 227 are provided as substantially the same patterns, and are patterned to preclude the region where the gate pad portion 228p is to be formed (see FIG. 11B). Accordingly, if the current flows in the first source electrode layer 217 (and the second source electrode layer 227) in a horizontal direction to the surface of the substrate, the current has to go all the way around the gate pad portion 228p. Consequently, a problem of higher on-resistance occurs in the region having a longer current pass.

According to this first embodiment, however, the first source electrode layer 17 and some of the cells 21 are provided below the gate pad portion 28p. Accordingly, the pass for the current flowing in the first source electrode layer 17 in a horizontal direction to the surface of the substrate is formed in the following, favorable way. No current pass that goes all the way around the gate pad portion 28p is formed even for the cells located at the end portion of the first source electrode layer 17. To put it differently, as the arrows in FIG. 1A shows, the current pass for any of all the cells 21 located in the device region 20 can be straight and can thus be as short as possible. Accordingly, in comparison with the conventional case, the difference between the regions of longer current passes and the regions of shorter current passes can be reduced in the device region 20.

In addition, according to this first embodiment, the gate pad portion 28p and the protection diode Di are located to make the distance LG between the gate pad portion 28p and the protection diode Di can be as short as possible. The gate pad portion 28p is connected through the first gate electrode layer 18 to the protection diode Di provided on the surface of the substrate SB. Various kinds of restraints are sometimes imposed on the location of the gate pad portion 28p and that of the protection diode Di. Such restraints derive from the need for the connections to external devices or from the characteristics of the semiconductor chip.

Specifically, in the case of, for example, a structure including bump electrodes, the positions of the bump electrodes are limited by the patterns of mounting substrate where the semiconductor tip is mounted. In addition, the position of the gate pad portion 28p is sometimes determined as the user demands (so is the position of the source pad portion 27p). In particular, as the chip size becomes larger, the positions of the bump electrodes are more likely to be shifted from the peripheral portions of the chip towards the center of the chip. Accordingly, the source pad portion 27p and the gate pad portion 28p are sometimes located at the inner side than the outermost cells 21 of the device region 20.

Meanwhile, no cells 21 can be provided below the protection diode Di, so that the region below the protection diode Di is the region where no transistor is (can be) formed in a characteristic viewpoint. In addition, if the currents flowing in the first source electrode layer 17 through particular cells 21 have to go all the way around the area where the protection diode Di is located, the differences between the longer current passes and the shorter current passes become larger. Accordingly, the protection diode Di is desirably located outside the device region 20 and at an end portion of the chip (in a region extending along one of the sides of the chip).

Accordingly, the gate pad portion 28p and the protection diode Di are provided at their respective appropriate positions, and are connected to each other by the wiring portion 28w, the contact portion 28c and the first gate electrode layer 18. Here, the position of the protection diode Di can be determined relatively freely as long as the protection diode Di is located outside the device region 20 and at an end portion of the chip. So, the protection diode Di is positioned in the closest proximity to the gate pad portion 28p. Consequently, the length L of the wiring portion 28w that connects the gate pad portion 28p to the protection diode Di becomes as short as possible.

According to this first embodiment, in the device region 20, only the first source electrode layer 17 is located below the second gate electrode layer 28 (see FIG. 3). Accordingly, as compared to the region where the first source electrode layer 17 and the second source electrode layer 27 are located, the resistance in the first source electrode layer 17 becomes high.

A smaller area occupied by the second gate electrode layer 28 is more favorable for reducing the resistance in the first source electrode layer 17. Nevertheless, as described above, the area and the position of the gate pad portion 28p and those of the protection diode Di are restrained to a certain degree.

To address this problem, in this first embodiment, the protection diode Di and the gate pad portion 28p are located in the closest possible proximity to each other while sufficient areas are secured for the protection diode Di and the gate pad portion 28p and the positions of the protection diode Di and the gate pad portion 28p are determined by taking account of their respective favorable positions in terms of design and characteristics.

Specifically, the protection diode Di is positioned at an end portion of the chip so as not to overlap the gate pad portion 28p. In addition, the protection diode Di and the gate pad portion 28p are positioned in the closest possible proximity to each other.

Figure 4:
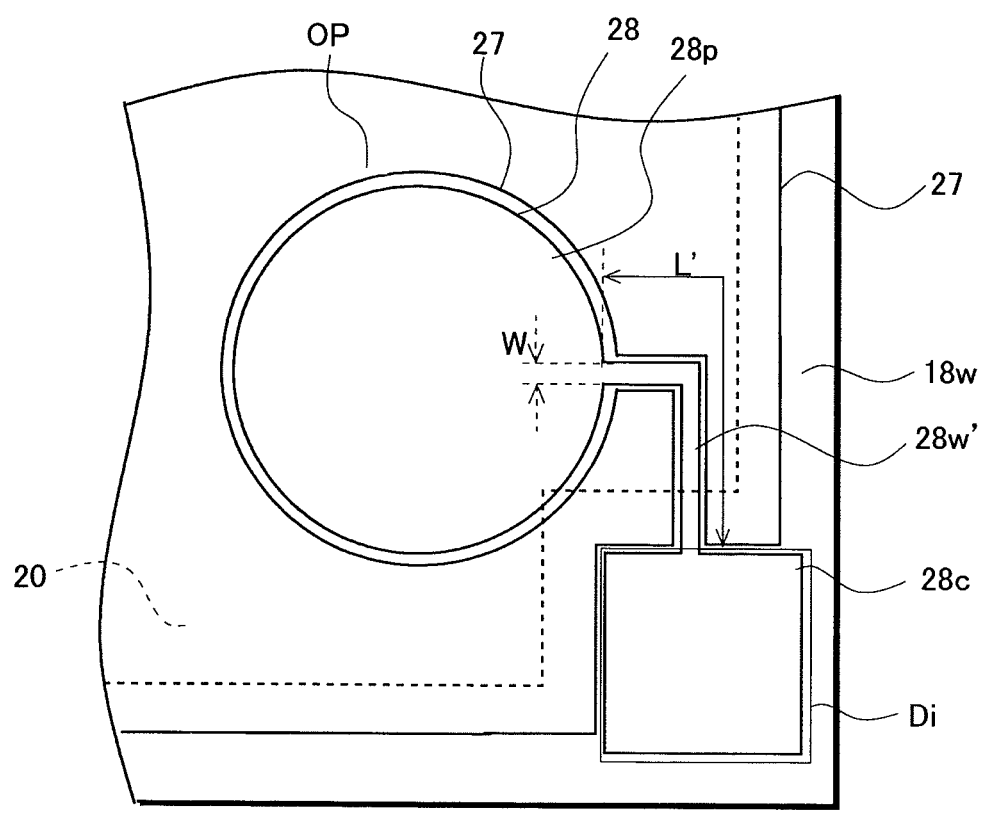
FIG. 4 is a plan view describing an insulated gate semiconductor device according to a comparative example of the first embodiment of the invention.

FIG. 4 is a plan view provided for the comparative purposes and illustrating another pattern of the second gate electrode layer 28 of the case where each of the source electrode layer and the gate electrode layer has a two-layer structure as in the case of this first embodiment. Those constituent elements identical to those in FIGS. 1A and 1B are denoted by the same reference numerals. The position of the protection diode Di may be at a corner portion such as one shown in FIG. 4. This is because if the protection diode Di is positioned outside the device region 20 and at an end portion of the chip to be adjacent to the device region 20, the area of the disable region can be reduced.

In this case, however, the length L' of a wiring portion 28w' is longer than the length L of the wiring portion 28w of this first embodiment. If the widths W (see FIG. 1B) of the two wiring portions 28w and 28w' are the same, the pattern shown in FIG. 4 has a larger area, so that the resistance in the first source electrode layer 17 becomes higher in the case of FIG. 4.

In contrast, according to this first embodiment, the length L of the wiring portion 28w is the shortest (so that the area of the wiring portion 28w becomes the smallest), and thus the area located below the wiring portion 28w and occupied by only the first source electrode layer 17 can be reduced. Thus accomplished is smaller resistance for the current flowing through the first source electrode layer 17.

Accordingly, a largest possible area where efficient transistor operation is possible can be secured as the device region 20, the area located below the wiring portion 28w and occupied by only the first source electrode layer 17 can be reduced, and the resistance for the current flowing through the first source electrode layer 17 can be reduced.

The influence of the wiring portion 28w on the resistance in the region below the wiring portion 28w depends not only on the length L of the wiring portion 28w but also on the width W of the wiring portion 28w. Specifically, a larger width W of the wiring portion 28w (a larger area occupied by the wiring portion 28w) results in a larger area occupied by only the first source electrode layer 17, so that the resistance for the current flowing through the first source electrode layer 17 becomes higher. So it is desirable that the width W of the wiring portion 28w be as small as possible.

Each of the first source electrode layer 17 and the second gate electrode layer 28, however, is generally a thick layer, so that there is a limit for the width W to be made narrower by etching.

Suppose an example where the first source electrode layer 17 has a 3-μm thickness, the first insulating film 23 has a 7000-Å thickness, and the second gate electrode layer 28 has a 3-μm thickness. If the width W of the wiring portion 28w is too small, defective etching occurs. Or even though etching is possible, the wiring portion 28w might be broken by the difference between the level of the first source electrode layer 17 and that of the first insulating film 23.

Accordingly, the width W is selected as small as possible but large enough not to cause any breaking of wiring to occur by taking account of the thicknesses of the first source electrode layer 17 and the first insulating film 23. Consequently, the area of the wiring portion 28w can be made as small as possible, so that the resistance can be prevented from becoming higher.

Making the area of the wiring portion 28w as small as possible allows the area of the portion where the second gate electrode layer 28 is to be provided (see FIG. 2B). This contributes to reduction in on-resistance.

Note that if the length between the gate pad portion 28p and a possible position of the protection diode Di (i.e., a possible length L of the wiring portion 28w) is equal to the length between the gate pad portion 28p and another possible position of the protection diode Di (i.e., another possible length L of the wiring portion 28w), the position of the protection diode Di is chosen from the two so that none of the currents flowing in the first source electrode layer 17 through the transistor cells 21 should take all the way around the protection diode Di (or so that such detouring currents flows in the first source electrode layer 17 through lesser number of transistor cells 21).

In addition, even if the device region 20 and the first source electrode layer 17 are located in the region far from the source pad portion 27p, the current passes for the currents flowing in the first source electrode layer 17 become longer so that the resistance in the first source electrode layer 17 becomes higher. Accordingly, it is desirable to place the protection diode Di in such an inefficient region as the above-described one in terms of the transistor performance. This is desirable because the placement can secure a larger area for using the larger area efficiently as the device region 20.

Now, the characteristics of the MOSFET 10 of this first embodiment (i.e., the common-drain MOSFET 100) and the characteristics of the common-drain MOSFET having a conventional structure will be described below by referring to FIG. 5.

Figure 5:
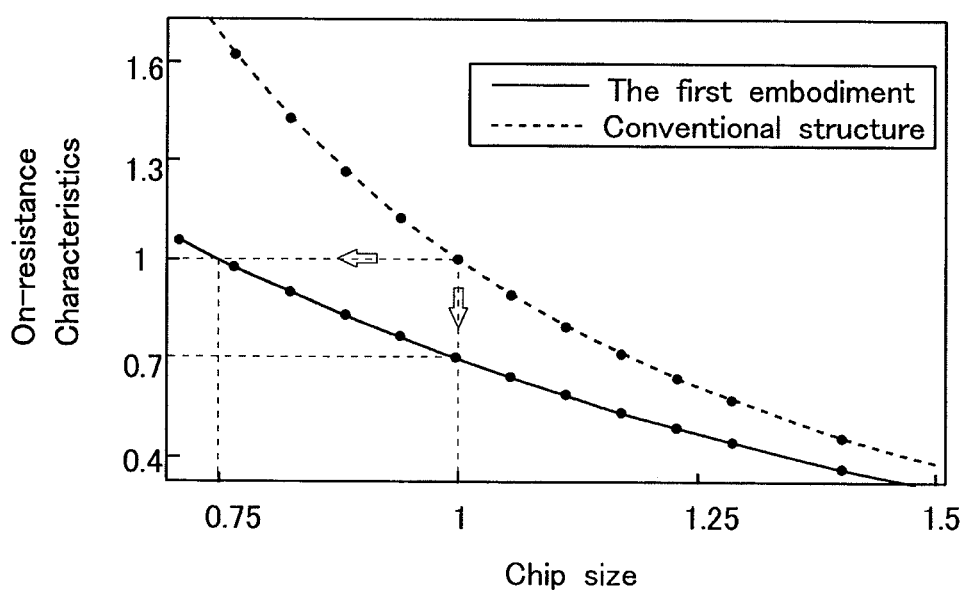
FIG. 5 is a characteristic chart describing the insulated gate semiconductor device according to the first embodiment of the invention.

The solid line in FIG. 5 represents the characteristics of the first embodiment whereas the dashed line represents the characteristics of the MOSFET of a conventional structure. Note that the sizes of the two MOSFETs are the same. The horizontal axis represents the chip size whereas the vertical axis represents the on-resistance characteristics. Note that the scales of the graph shown in FIG. 3 are expressed by relative values.

In comparison to the chip having a conventional structure (chip size=1, on-resistance characteristics=1), the chip having the structure of this first embodiment can achieve an approximately 30% reduction in on-resistance if the sizes of the two chips are the same, or the chip having the structure of this first embodiment can achieve an approximately 25% reduction in chip size if the on-resistance characteristics are kept at the conventional level.

In particular, if employed in a product of small chip size (chip size=1 or smaller), the first embodiment of the invention has greater effects (see, for example, the cases of chip size=1.25). In conventional cases, a smaller chip size drastically impairs the on-resistance characteristics (see the dashed line in FIG. 5), because the area occupied by the gate pad portion is large and no cells are allowed to be placed below the large-area gate pad portion.

According to this first embodiment, however, some of the cells 21 can be positioned below the gate pad portion 28p. So, favorable on-resistance characteristics can be obtained irrespective of how large the area occupied by the gate pad portion 28p is. Accordingly, a chip of a smaller size (e.g., chip size=0.75) has a larger absolute value of the on-resistance than the corresponding value for a chip of a larger size (e.g., chip size=1.25) and has a larger effect than the larger-sized one.

Figure 6A:
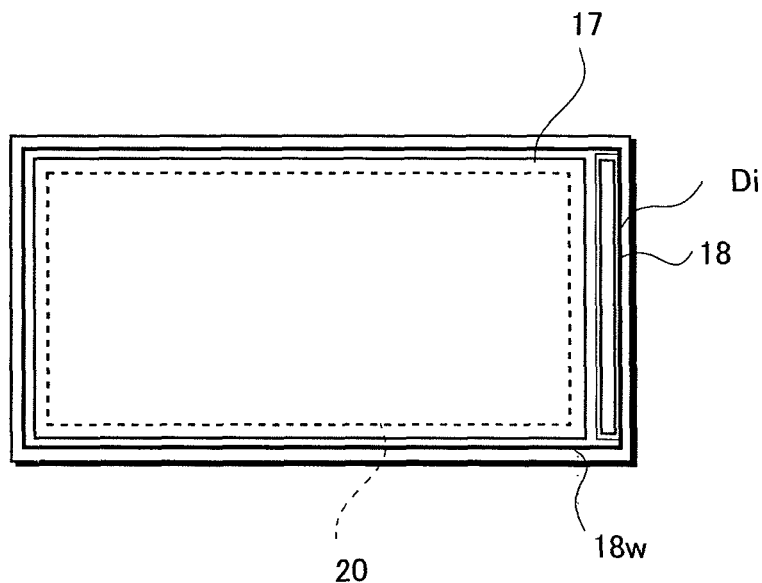
FIGS. 6A and 6B are plan views describing an insulated gate semiconductor device according to a second embodiment of the invention.
Figure 6B:
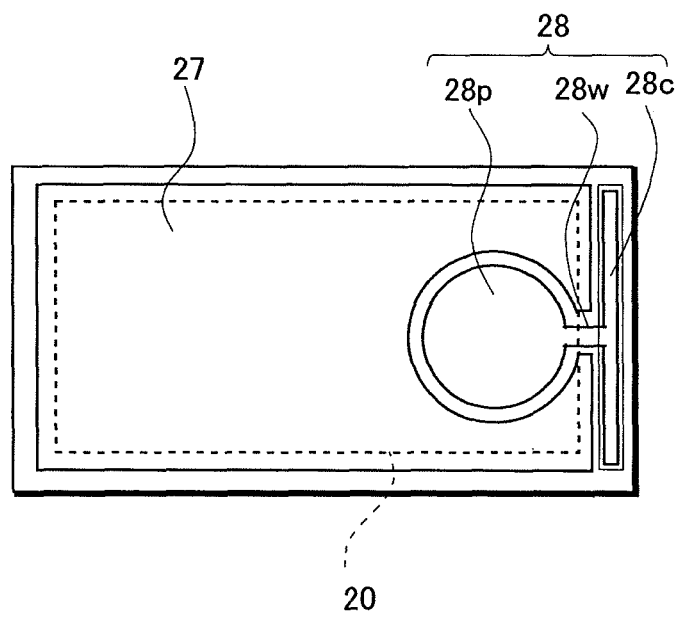
Figure 7A:
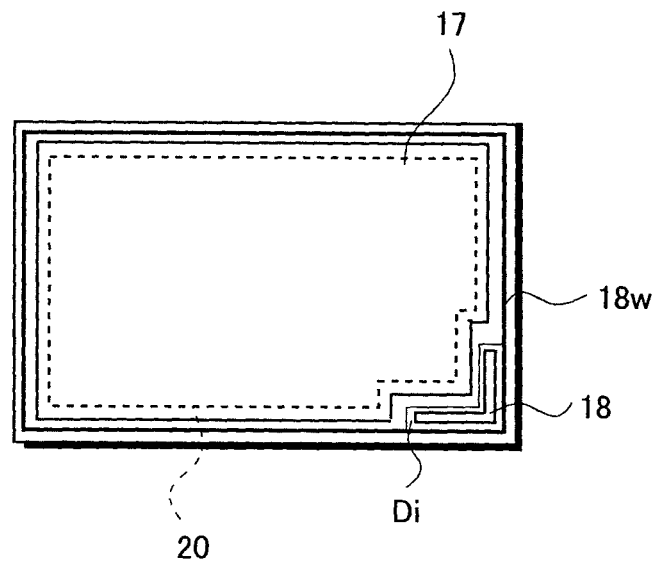
FIGS. 7A and 7B are plan views describing the insulated gate semiconductor device according to the second embodiment of the invention.
Figure 7B:
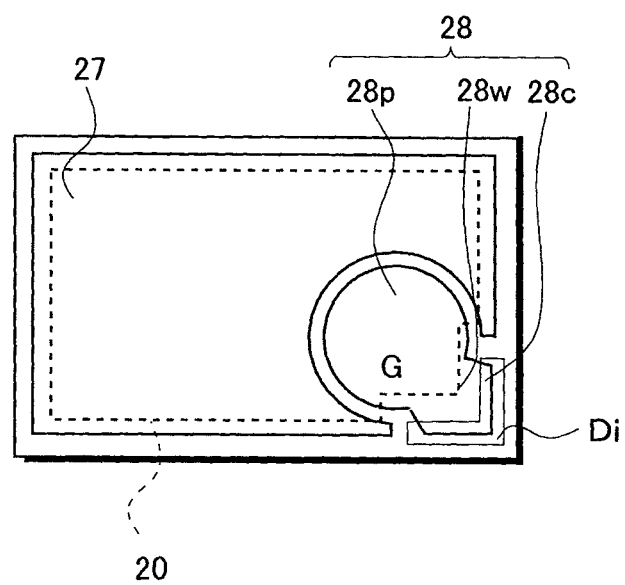

A second embodiment of the invention will be described below by referring to FIGS. 6A to 7B. In the second embodiment, a protection diode Di has a modified pattern. FIGS. 6A and 7A are plan views of the entire chip each illustrating the patterns of a first source electrode layer 17 and a first gate electrode layer 18. FIGS. 6B and 7B are plan views of the entire chip each illustrating the patterns of a second source electrode layer 27 and a second gate electrode layer 28.

In this second embodiment, a gate pad portion 28p and the protection diode Di are positioned in the closest possible proximity to each other. As the size of the chip becomes smaller, the above-mentioned placement of the gate pad portion 28p and the protection diode Di might cause the gate pad portion 28p to overlap the protection diode Di if the protection diode Di has an ordinary shape (e.g., concentric shape). What has to do to avoid such overlapping is changing the shape of the protection diode Di, for example, to a strip shape (see FIGS. 6A and 6B) or an L-shape (see FIGS. 7A and 7B)

If the protection diode Di has an L-shape, the distances from various points on the protection diode Di to the gate pad portion 28p differ from one another. In this case, a wiring portion 28w is formed at such a position that the length L of the wiring portion 28w can be as short as possible, and the protection diode Di and the gate pad portion 28p are connected to each other through the shortest wiring portion 28w.

For example, in FIG. 7B, the distance from the gate pad portion 28p to each of the two ends (the upper end and the left-side end) of the L-shaped protection diode Di is shorter than any other distances from the gate pad portion 28p to points on the protection diode Di. If the wiring portion 28w is formed into a pattern to connect the protection diode Di and the gate pad portion 28p with the shortest distance, the width of the wiring portion 28w might be so small that the etching is difficult or breaking of wiring may occur if the wiring portion 28w has a thickness of a certain range. What has to do to avoid this problem is, as FIG. 7B shows, making the wiring portion 28w have a width large enough to eliminate the possibility of wire-breaking and defective etching. Such a width has to be secured also in the regions where the distance between the protection diode Di and the gate pad portion 28p is the shortest.

In addition, though not illustrated, the gate pad portion 28p and the protection diode Di may be positioned not to overlap each other but to be adjacent to each other. In this case, the second gate electrode layer 28 located between the gate pad portion 28p and a contact portion 28c serves as the wiring portion 28w. The second gate electrode layer 28 in this case is so small that such a second gate electrode layer 28 hardly exists.

If the pattern includes no wiring portion 28w, the area occupied by only the first source electrode layer 17 hardly exists. Such a configuration is favorable to reduce the resistance. Specifically, it is possible to make the pattern of the protection diode Di larger and the wiring portion 28w shorter. In this case, however, a device region 20 becomes smaller. For this reason, in the configuration to be employed, the area of the protection diode Di is large enough to satisfy the requirements of characteristics, and the protection diode Di and the gate pad portion 28p are positioned in the proximity to each other.

As in the case of the first embodiment, for reducing the resistance, the width W of the wiring portion 28w should be as small as what the manufacturing process permits so as to contribute to reduction in resistance. Nevertheless, if the difference in level below the wiring portion 28w might cause breaking of wiring, the width W should be as large as what the requirement of the characteristics permits (see FIG. 7B).

Also according to this second embodiment, the gate pad portion 28p and the protection diode Di do not overlap each other. Accordingly, plural cells 21 are provided right below the gate pad portion 28p. The remaining parts of the configuration in this second embodiment are the same as their respective counterparts in the first embodiment. So, no detailed description will be given for those parts.

In addition, since the first source electrode layer 17 can be positioned below the gate pad portion 28p, the current flowing in the first source electrode layer 17 in a horizontal direction to the substrate does not have to go all the way around the gate pad portion 28p. Accordingly, effects similar to those obtained in the first embodiment can be obtained in this second embodiment.

Note that even if the shape of the protection diode Di is modified into, for example, a stripe shape or an L-shape, a preferable pattern of pn junctions is one with closed-loop homologous shapes that overlap one another, because the pattern can prevent leakage current from occurring.

Now, a third embodiment of the invention will be described below by referring to FIGS. 8A and 8B. The semiconductor device of the third embodiment is a MOSFET 10 of what is termed as an up-drain structure. Specifically, in the up-drain-structure MOSFET 10, the drain electrode is extracted to the principal surface on a gate pad 28p side, and a drain electrode layer is thus formed as a third terminal electrode layer.

FIGS. 8A and 8B are plan views. FIG. 8A illustrates the structure of the first one of electrode layers. FIG. 8B illustrates the second one of the electrode layers. Note that the first one of the electrode layers is indicated by alternate long and short lines in FIG. 8B.

In the up-drain-structure MOSFET 10, a gate pad portion 28p, a source pad portion 27p, and a drain pad portion 29p are formed on a first principal surface of a substrate (chip). The drain pad portion 29p is an extracted portion of the drain electrode, which is to be connected to a third terminal of each MOS transistor. As external connection means, a gate bump electrode 38, a source bump electrode 37, and a drain bump electrode 39 are formed respectively on the gate pad portion 28p, the source pad portion 27p, and the drain pad portion 29p. In this case, the source bump electrode 37 is connected to an input terminal, and the drain bump electrode 39 is connected to an output terminal.

A first drain electrode layer 19 is formed as the outermost portion of a substrate SB. On the substrate SB below the first drain electrode layer 19, the extracted portion of the drain electrode and a high-concentration n type impurity region that is to be an annular are formed into patterns that overlap the first drain electrode layer 19. A device region 20 is formed in a region indicated by the dashed line in FIGS. 8A and 8B. A first source electrode layer 17 is formed to cover the device region 20. A first gate electrode layer 18 is formed between the first source electrode layer 17 and the first drain electrode layer 19. The first gate electrode layer 18 is close to the outermost cells in the device region 20, and is formed in such a manner as to surround the outermost cells. The first drain electrode layer 19 is formed around the first gate electrode layer 18.

A second drain electrode layer 29 that has a flat-plate shape is formed so as be along one side of the substrate SB, and overlaps a portion of the first drain electrode layer 19. A second source electrode layer 27 that has a flat-plate shape is formed to overlap the first source electrode layer 17 except the region where the gate pad portion 28p is to be positioned.

A second gate electrode layer 28 includes the gate pad portion 28p and a wiring portion 28w as in the cases of the first and the second embodiments. The wiring portion 28w extends between the second drain electrode layer 29 and the second source electrode layer 27. A portion of the wiring portion 28w overlaps the first gate electrode layer 18 and is connected to the first gate electrode layer 18. The gate pad portion 28p overlaps a portion of the first source electrode layer 17 with an insulating film (not illustrated) located in between.

A protection diode Di is formed below the first gate electrode layer 18. A portion of the protection diode Di overlaps the first gate electrode layer 18, and the protection diode Di is connected to the first gate electrode layer 18. The protection diode Di is provided at an end portion of the chip. Specifically, the protection diode Di is positioned outside the device region 20 in such a way as to be adjacent to the device region 20. The protection diode Di is positioned in a region where no cells exist between one side (right-hand side) of the protection diode Di and one side (right-hand side) of the adjacent chip (semiconductor substrate). In addition, the protection diode Di is positioned so as not to overlap the gate pad portion 28*p* and in the closest proximity to the gate pad portion 28*p*.

Accordingly, the gate pad portion 28*p* and a portion of the wiring portion 28*w* do not overlap the protection diode Di. The first source electrode layer 17 and some of the cells are placed below the gate pad portion 28*p* and the portion of the wiring portion 28*w*. Such placement significantly reduces the area of the region where no transistor is (can be) formed, where no cells are placed, in comparison to the corresponding area in the conventional case.

Accordingly, if the size of the chip of this third embodiment and the size of the chip of the conventional case are the same, enlarging the area of the device region 20 can reduce the on-resistance. In addition, if the area of the device region 20 of this third embodiment is kept equal to the area of the conventional case, the area of the region where no transistor is (can be) formed below the gate pad portion 28*p* can be reduced from the larger area of the region where no transistor is (can be) formed of the conventional case. Thus, reduction in size of a chip can be achieved.

In addition, although the MOSFET of this third embodiment is an up-drain-structure MOSFET 10, the first source electrode layer 17 and some of the cells can be arranged below the gate pad portion 28*p*. Accordingly, the pass for the current flowing in the first source electrode layer 17 in a horizontal direction to the substrate (in the direction indicated by the arrow in FIG. 8A) is formed in the following, favorable way. No current pass that goes all the way around the gate pad portion 28*p* is formed. Consequently, in comparison to the conventional case, the difference between the regions of longer current passes and the regions of shorter current passes can be reduced. In addition, the resistance of the first source electrode layer 17 below the wiring portion 28*w* can be reduced.

Now, a fourth embodiment of the invention will be described by referring to FIG. 9. In the fourth embodiment, a bonding wire is used as the external connection means.

Figure 9:
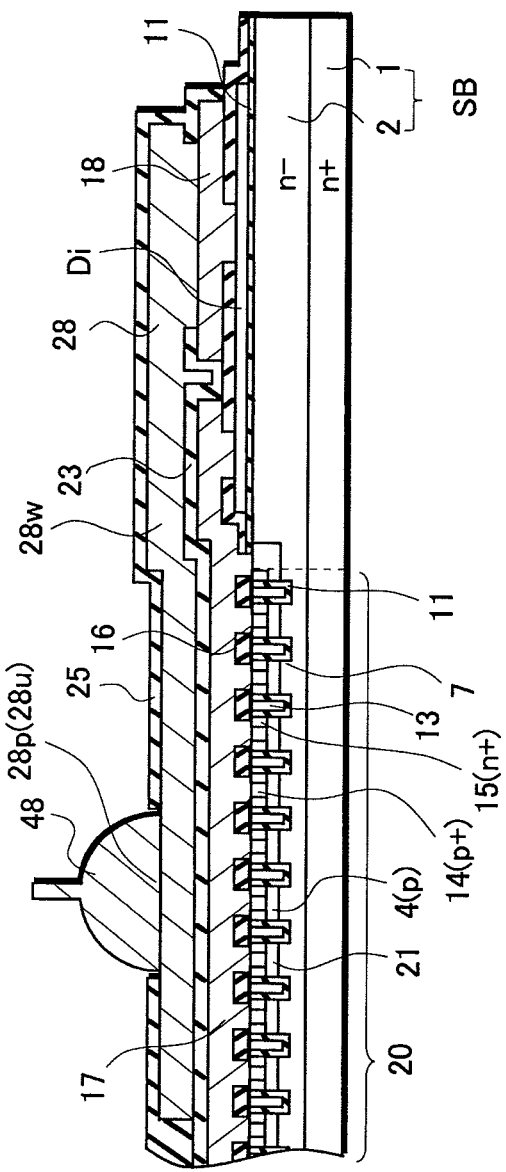
FIG. 9 is a sectional view describing an insulated gate semiconductor device according to a fourth embodiment of the invention.
Figure 10:
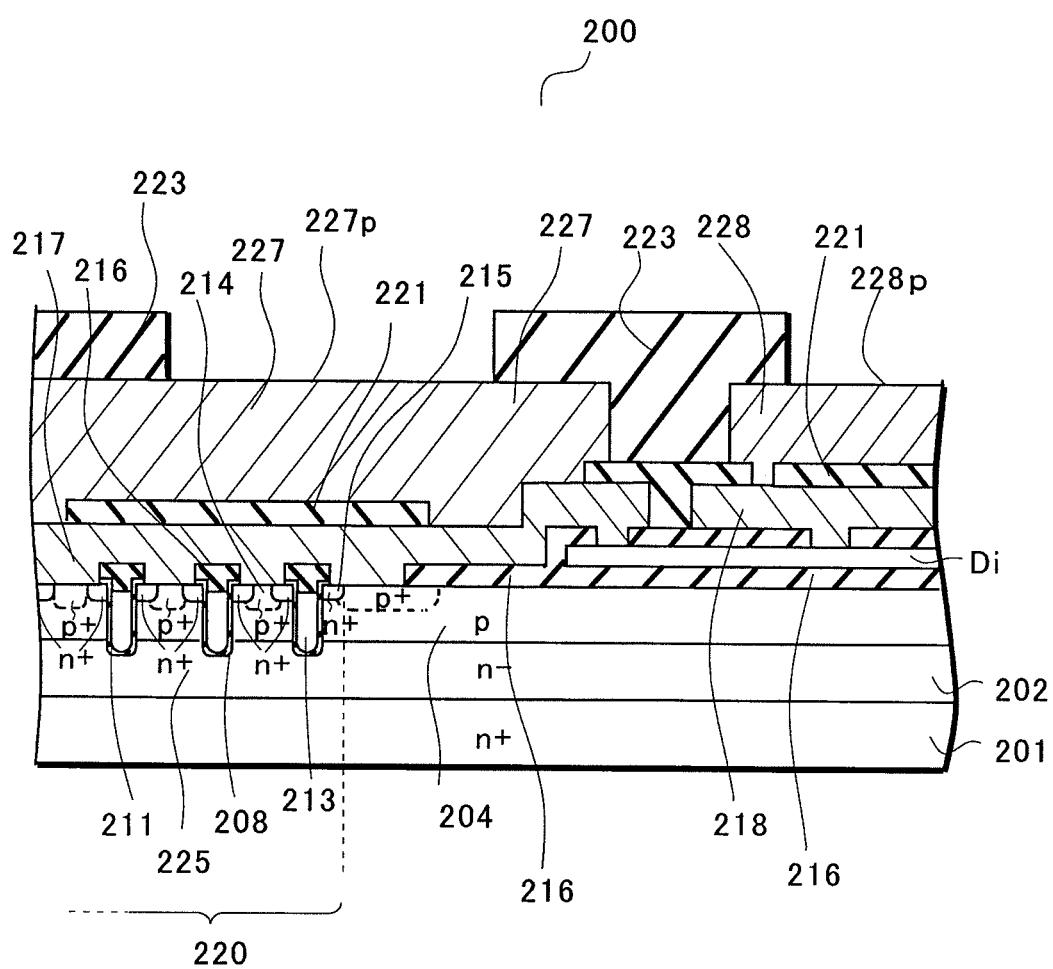
FIG. 10 is a sectional view describing a conventional insulated gate semiconductor device.

FIG. 9 is a sectional view illustrating a portion of a gate pad portion 28*p*. On a second gate electrode layer 28 (also on a second source electrode layer 27), a second insulating film (e.g., a nitride film) 25 is generally formed as the outermost surface of the chip. An opening portion is formed in a desired region of the second insulating film 25 so as to expose a portion of the second gate electrode layer 28. The exposed portion of the second gate electrode layer 28 is the gate pad portion 28*p*. A bonding wire 48 serving as external connection means is bonded to the gate pad portion 28*p*. The remaining parts of the configuration in this fourth embodiment are the same as their respective counterparts in the first embodiment. So, no detailed description will be given for those parts. In addition, this fourth embodiment is similarly applicable to the pattern of the second gate electrode layer 28 of the second embodiment.

In addition, though not illustrated, the fourth embodiment is applicable to a case where a metal plate is used as external connection means.

Although a case of n channel type MOSFETs has been described as an example in this embodiment of the invention, the preferred embodiment of the invention is applicable to a case of p channel type MOSFETs, that is, MOSFET of the opposite conductivity type, and similar effects can be obtained.

In addition, the preferred embodiment of the invention is similarly applicable to a case of a planer-type MOSFET in which the gate electrode is patterned on an insulating film formed on the surface of a substrate.

Furthermore, although a case where MOSFETs are formed in a device region has been described as an example in this embodiment of the invention, the preferred embodiment of the invention is applicable similarly to a case of an IGBT, which is a composite device of a MOSFET and a BJT (bipolar-junction transistor). The IGBT has a structure in which a p+ type semiconductor substrate is provided below an n+ type silicon semiconductor substrate of the above-described MOSFET. The structure of the IGBT is basically the same as the structure of the above-described MOSFET except that in the IGBT, an emitter electrode layer is a first terminal electrode layer, a gate electrode layer is a second terminal electrode layer, and a collector electrode layer is a third terminal electrode layer. Accordingly, the structure of the gate electrode layer (a first gate electrode layer and a second gate electrode layer) is the same as that in each of the above-described embodiments, and similar effects can be obtained.

Firstly, according to preferred embodiments of the invention, the gate electrode layers have a two-layer structure with a first gate electrode layer including a gate pad portion and a second gate electrode layer which is located below the first gate electrode layer and which is connected to a gate extraction electrode. In addition, the gate pad portion does not overlap the protection diode. Accordingly, some of the transistor cells can be arranged below the gate pad portion.

Even if the protection diode is smaller than the gate pad portion, a sufficient breakdown voltage can be often secured. Even in this case, the protection diode and the gate pad portion overlap each other in conventional cases. So, in conventional cases, a larger area is occupied by the region where no transistor is (can be) formed.

According to the preferred embodiments of the invention, the area of the protection diode is as small as necessary for securing a certain breakdown voltage, and the gate pad portion and the protection diode do not overlap each other. Accordingly, transistor cells can be arranged below the gate pad portion. Consequently, the device region, which operates effectively as a transistor, can be expanded in size. To put it differently, if a chip of any embodiment of the invention has the same size as a conventional chip has, the chip of the preferred embodiment of the invention can achieve an expansion of the device region and a reduction in on-resistance. Alternatively, if a chip of any preferred embodiment of the invention has the area of the device region equal to the corresponding area in conventional cases, the size of chip can be made smaller.

In addition, according to the preferred embodiments of the invention, the gate pad portion and the protection diode are provided in the closest possible proximity to the protection diode. Accordingly, the resistance for the current flowing through the source electrode layer can be prevented from increasing. Specifically, the gate pad portion, which is a portion of a second one of the gate electrode layers (i.e., the second gate electrode layer), is connected, with the first one of the gate electrode layers interposed in between, to the protection diode formed on the substrate surface. Various restraints are sometimes imposed on the positions of the gate pad portion and of the protection diode. Such restraints derive, for example, from the need for external connection and the characteristics of the semiconductor device. With the restraints, the second gate electrode layer needs to include a wiring portion to connect the gate pad portion to the protection diode. According to the preferred embodiments of the invention, the source electrode layers also have a two-layer structure. In a region where the wiring portion is located, the source electrode layer has a one-layer structure, resulting in a problem of higher resistance for the current flowing in the first one of the source electrode layers (a first source electrode layer). According to the preferred embodiments of the invention, however, the length of the wiring portion can be as short as possible. For this reason, the increase in the resistance can be prevented by making the area (width) of the wiring portion as small as possible by taking the restraints imposed by the required characteristics and by the manufacturing process.

Secondly, according to the preferred embodiments of the invention, the first source electrode layer and some of the transistor cells can be arranged below the gate pad portion. In addition, the first source electrode layer can be formed to reach the end portions of the chip and to preclude the region where the protection diode is to be formed. Accordingly, even for the cells located at the end portions of the first source electrode layer, no current passes going all the way around the gate pad portion are formed. To put it differently, the current passes for all the cells in the device region can be formed from the cells to the source pad portion in a straight manner (to have the shortest distance). In comparison to the conventional cases, the difference in the resistance can be reduced, and the characteristics of the MOSFET can be improved.

Thirdly, according to the preferred embodiments of the invention, the protection diode is provided to be in the closest proximity to the gate pad portion, and to be outside the device region and adjacent to the device region. The protection diode is positioned as far away as possible from the source pad portion. In the region far away from the source pad portion, it is difficult to accomplish a transistor operation even if the device region and the source electrode layer are formed in such a remote region. The resistance of the remote region is so high that the remote region cannot be used effectively as the device region. According to the preferred embodiments, the protection diode is positioned in the remote region. Accordingly, the device region where effective transistor operation is possible can be secured more efficiently.

Fourthly, according to the preferred embodiments of the invention, the wiring portion is formed widely within in a permissible range in terms of the resistance. Accordingly, the wire-breakage can be prevented from being caused by the difference in the level located below the wiring portion.

Fifthly, it is advantageous that the preferred embodiments of the invention can be carried out by modifying the mask pattern from the one used in the case of a conventional two-layer electrode structure.

What is claimed is:

1. An insulated gate semiconductor device comprising:
   a semiconductor substrate;
   a device region which is a region of the semiconductor substrate in which a plurality of cells of insulated gate transistors are formed, each of the transistors includes a source region;
   a first top terminal electrode layer disposed on the semiconductor substrate so as to cover a first portion of the device region, the first top terminal electrode layer being electrically connected to the device region but not being in direct physical contact with the first portion, the first portion having the cells formed therein;
   a second top terminal electrode layer disposed on the semiconductor substrate so as to cover a second portion of the device region, the second top terminal electrode layer being electrically connected to the device region but not being in direct physical contact with the second portion, the second portion having the cells formed therein, the second top terminal layer comprising a pad portion to which an electrical connection is made to receive a control signal for the transistors in the device region; and
   a protection diode formed in the semiconductor substrate so as to be outside the device region but adjacent the device region,
   wherein in plan view of the semiconductor substrate the pad portion and the protection diode do not overlap,
   the protection diode is disposed in a peripheral region of the semiconductor substrate and extends along at least one side of the semiconductor substrate,
   the cells are disposed below the pad portion so that the cells and the pad portion overlap in plan view of the semiconductor substrate, and
   the source regions of the transistors are disposed below the pad portion so that the source regions and the pad portion overlap in plan view of the semiconductor substrate.

2. The insulated gate semiconductor device of claim 1, wherein the second top terminal electrode layer comprises a wiring portion that connects the pad portion and a portion of the second top terminal electrode layer covering the protection diode with the shortest distance between the pad portion and the portion covering the protection diode.

3. The insulated gate semiconductor device of claim 1, further comprising a first bottom terminal electrode layer disposed between the first top terminal electrode layer and the device region so as to cover the entire device region and be electrically connected to the first top terminal electrode layer, and a second bottom terminal electrode layer disposed between the second top terminal electrode layer and the protection diode so as to be outside the device region and be electrically connected to the second top terminal electrode layer.

4. The insulated gate semiconductor device of claim 3, wherein a first end of the protection diode is in contact with the first bottom terminal electrode layer, and a second end of the protection diode is in contact with the second bottom terminal electrode layer.

5. The insulated gate semiconductor device of claim 3, wherein the second top terminal electrode layer comprises a wiring portion that connects the pad portion and a portion of the second top terminal electrode layer covering the protection diode, and the portion covering the protection diode is in contact with the second bottom terminal electrode layer.

6. The insulated gate semiconductor device of claim 5, wherein the cells are provided below the wiring portion.

7. An insulated gate semiconductor device comprising:
   a semiconductor substrate;
   a device region which is a region of the semiconductor substrate in which a plurality of cells of insulated gate transistors are formed, each of the transistors includes a source region;
   a protection diode formed in the semiconductor substrate so as to be outside the device region but adjacent the device region;
   a first bottom terminal electrode layer covering the entire device region;
   a second bottom terminal electrode layer covering the protection diode;
   a first top terminal electrode layer disposed on and connected to the first bottom terminal electrode layer; and a second top terminal electrode layer disposed on and connected to the second bottom terminal electrode layer and extending from a region above the protection diode to cover part of the first bottom terminal electrode layer, wherein the second top terminal electrode layer comprises a pad portion to which an electrical connection is made to receive a control signal for the transistors in the device region, the source regions of the transistors are disposed below the pad portion so that the source regions and the pad portion overlap in plan view of the semiconductor substrate, and in plan view of the semiconductor substrate the pad portion and the protection diode do not overlap.

* * * * *